(12) United States Patent
Jang et al.

(10) Patent No.: US 6,326,294 B1
(45) Date of Patent: Dec. 4, 2001

(54) METHOD OF FABRICATING AN OHMIC METAL ELECTRODE FOR USE IN NITRIDE COMPOUND SEMICONDUCTOR DEVICES

(75) Inventors: Ja Soon Jang; Tae Yeon Seong; Seong Ju Park, all of Kwangju (KR)

(73) Assignee: Kwangju Institute of Science and Technology, Kwangju (KR)

( * ) Notice: Subject to any disclaimer, the term of this patent is extended or adjusted under 35 U.S.C. 154(b) by 0 days.

(21) Appl. No.: 09/840,171

(22) Filed: Apr. 24, 2001

(30) Foreign Application Priority Data

Apr. 27, 2000 (KR) .................................................. 00-22371
Feb. 12, 2001 (KR) .................................................... 01-6826

(51) Int. Cl.$^7$ .................................................. H01L 21/28
(52) U.S. Cl. .......................... 438/604; 438/46; 438/602; 438/603; 438/605; 438/606
(58) Field of Search ............................... 438/46, 602–606

(56) References Cited

U.S. PATENT DOCUMENTS 6,100,174 * 8/2000 Takatani .............................. 438/605

OTHER PUBLICATIONS

Applied Physics Letters, vol. 73, No. 7, Aug. 17, 1998, "*Thermal Stability of W and $WSI_x$ contacts on p–GaN*," pp. 942–944.

Applied Physics Letters, vol. 74, No. 2, Jan. 11, 1999, "*Low–resistance Ta/Ti Ohmic contacts for p–type GaN*," pp. 275–277.

* cited by examiner

Primary Examiner—John F. Niebling
Assistant Examiner—David A Zarneke
(74) Attorney, Agent, or Firm—Foley & Lardner

(57) ABSTRACT

A method of fabricating on ohmic metal electrode. The p-type ohmic metal electrode according to the present invention employs Ru and $RuO_x$ as the cover layer in lieu of conventional Au, in order to effectively prevent penetration by contaminants in the air, such as oxygen, carbon, and $H_2O$, and to form a stable metal-Ga intermetallic phase at the junction between the contact layer and the nitride compound semiconductor. The n-type ohmic metal electrode according to the present invention employs Ru as the diffusion barrier in lieu of conventional Ni or Pt, in order to effectively form a metal-nitride phase such as titanium nitride that contributes to superior ohmic characteristics during the heating process, without destruction of the junction. According to the present invention, it is possible to fabricate devices having superior electrical, optical, and thermal characteristics compared with conventional devices.

14 Claims, 12 Drawing Sheets

METHOD OF FABRICATING AN OHMIC METAL ELECTRODE FOR USE IN NITRIDE COMPOUND SEMICONDUCTOR DEVICES

BACKGROUND OF THE INVENTION

1. Field of the Invention

The present invention relates to a method of fabricating an ohmic metal electrode for use in nitride compound semiconductor devices and, more particularly, to a method of fabricating a p-type ohmic metal electrode that uses Ru and $RuO_x$ as the cover layer. The present invention also relates to a method of fabricating an n-type ohmic metal layer that uses Ru as the diffusion barrier layer. Here, a nitride compound semiconductor refers to $Al_xIn_yGa_{1-(y+x)}N$, where $0 \leq x \leq 1$, $0 \leq y \leq 1$, and $x+y \leq 1$.

2. Description of the Prior Art

Fabrication of ohmic contacts is one of the techniques that are essential in fabricating opto-electronic devices such as nitride-base blue/green and white light emitting diodes (LED's), ultraviolet (UV) detectors, and laser diodes (LD's) and electronic devices such as high electron mobility transistors (HEMT's), metal-insulator-semiconductor field effect transistors (MISFET's), and heterostructure bipolar transistors (HBT's).

Conventionally, p-type ohmic metal electrodes for use in nitride-base optical devices and electronic devices employed Au, such as in Ni/Au, as the cover layer. However, various pollutants such as oxygen in the air penetrate through the Au cover layer to reach the underlying contact layer, thereby forming an oxide pollutant layer at the junction of the contact layer and the nitride semiconductor. Thus, the structural and thermal stability of the p-type ohmic metal electrode experiences degradation during the heating process, and the electrical, thermal, and optical characteristics are deteriorated.

In the case of n-type ohmic metal electrodes, an ohmic metal electrode with a Ti contact layer has been conventionally used. However, unnecessary interaction occurred between the contact layer and the nitride semiconductor during the heating process, and thus the thermal characteristics was not good despite good electrical characteristics. In order to overcome this disadvantage, diffusion barrier layers employing Ni or Pt between Ti/Al and Au, such as in Ti/Al/Ni/Au or Ti/Al/Pt/Au, were used. However, the results were not satisfactory.

In particular, in case of Au-base p-type ohmic metal electrodes, the optical output characteristics were significantly degraded because the photons generated in the optical devices were absorbed into the Au.

One of the most important techniques that need to be developed in fabricating laser diodes having a nitride compound semiconductor substrate is to develop an ohmic metal electrode having low resistance, high light transmittance, and thermal stability. However, there has been neither prior art nor any published research regarding Au-free p-type ohmic metal electrodes.

S. J. Pearton, et al. of the U.S.A. published their research regarding fabricating an ohmic contact layer on p-type GaN by using W and WSi in the American Institute of Physics in 1998 (Applied Physics Letters 73, 942, 1998). The object of the research was to develop an ohmic contact layer having thermal stability and good electrical characteristics. However, according to the publication, thermal stability was good, but specific contact resistance determinative of electrical characteristics was $10^{-2}$ $\Omega cm^2$, which is worse than $10^{-4}$ $\Omega cm^2$, the minimum acceptable value for optical devices.

Murakami, et al. published their research regarding Ta/Ti contact system in the American Institute of Physics in 1999 (Applied Physics Letters 74, 275, 1999). According to the publication, the specific contact resistance was $10^{-5}$ $\Omega cm^2$, which was very good, but there was a problem of instability at room temperature.

There were also reports on various researches regarding ohmic metal electrodes having other types of structures, but there has been no research resulting in superior characteristics sufficient for use in actual devices.

SUMMARY OF THE INVENTION

Therefore, it is an object of the present invention to provide a method of fabricating a p-type ohmic metal electrode that can solve the above-mentioned problems by using Ru and $RuO_x$, as the cover layer.

It is another object of the present invention to provide a method of fabricating an n-type ohmic metal electrode that can solve the above-mentioned problems by using Ru as the diffusion barrier layer.

To this end, the method of fabricating an ohmic metal electrode according to one embodiment of the present invention comprises the steps of sequentially forming a contact layer and a Ru layer on a p-type nitride compound semiconductor, and carrying out a heating process in air, argon, nitrogen, and/or oxygen atmosphere. Here, the heating process in air, argon, nitrogen, and/or oxygen atmosphere is carried out in order to form a $RuO_x$ layer on the surface of the Ru layer.

The method of fabricating an ohmic metal electrode according to another embodiment of the present invention comprises the steps of sequentially forming a contact layer and a Ru layer on a p-type nitride compound semiconductor, exposing the Ru layer to air, argon, nitrogen, and/or oxygen atmosphere, and carrying out a heating process. Here, the step of exposing the Ru layer to oxygen atmosphere is carried out in order to form a native $RuO_x$ layer on the surface of the Ru layer. The heating process is preferably carried out in air, argon, nitrogen, and/or oxygen atmosphere, but the air, argon, nitrogen, and/or oxygen atmosphere is not absolutely necessary since a native $RuO_x$ layer has already been formed before heating process.

The method of fabricating an ohmic metal electrode according to still another embodiment of the present invention comprises the steps of sequentially forming a contact layer, a metallic layer, and a $RuO_x$ layer on a p-type nitride compound semiconductor, and carrying out a heating process. The $RuO_x$ layer may be formed by sputtering, chemical vapor deposition, or molecular beam epitaxy, and there is no absolute need to form the metallic layer with Ru because the $RuO_x$ layer can be formed regardless of the type of the underlying layer.

In each of the above embodiments according to the present invention, the contact layer is comprised of a single-layer structure comprising Pt, Ti, Cr, Pd, Ni, Ta, W, or Mo, or a multi-layer structure comprising a combination of the single layer structures. When the contact layer is comprised of Pt, Pd, or Ni, the heating process is preferably carried out in a temperature range of 300~700° C.

The method of fabricating an ohmic metal electrode according to still another embodiment of the present invention comprises the steps of sequentially forming a contact layer, a Ru layer, and a conductive layer on an n-type nitride compound semiconductor, and carrying out a heating process.

Here, the contact layer is comprised of a single-layer structure comprising Ti, Cr, Mo, Nb, Ta, or W, or a multi-layer structure comprising a combination of the single layer structures. When the contact layer is comprised of Ti, the heating process is preferably carried out in a temperature range of 300~800° C.

DESCRIPTION OF THE PREFERRED EMBODIMENT

Figure 1A:
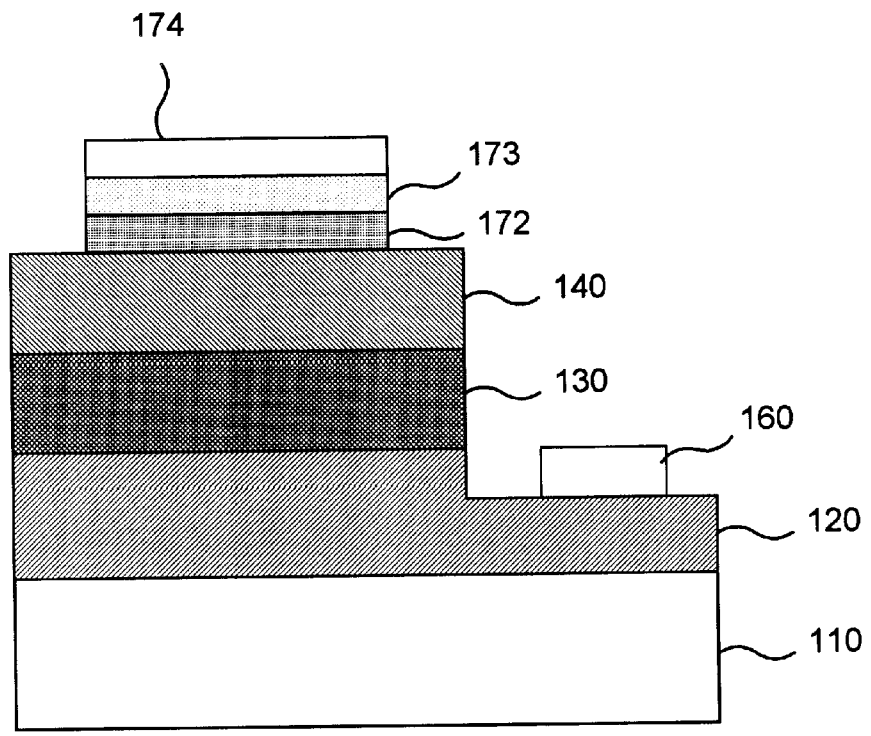
FIGS. 1A and 1B are cross-sectional diagrams for illustrating the method of fabricating a p-type ohmic metal electrode according to the first embodiment of the present invention.

The preferred embodiments of the present invention will be described hereinafter with reference to the attached drawings. Like reference numerals refer to like elements having like functions, and no repetitive descriptions of those elements will be set forth.

[The First Embodiment]

Figure 1B:
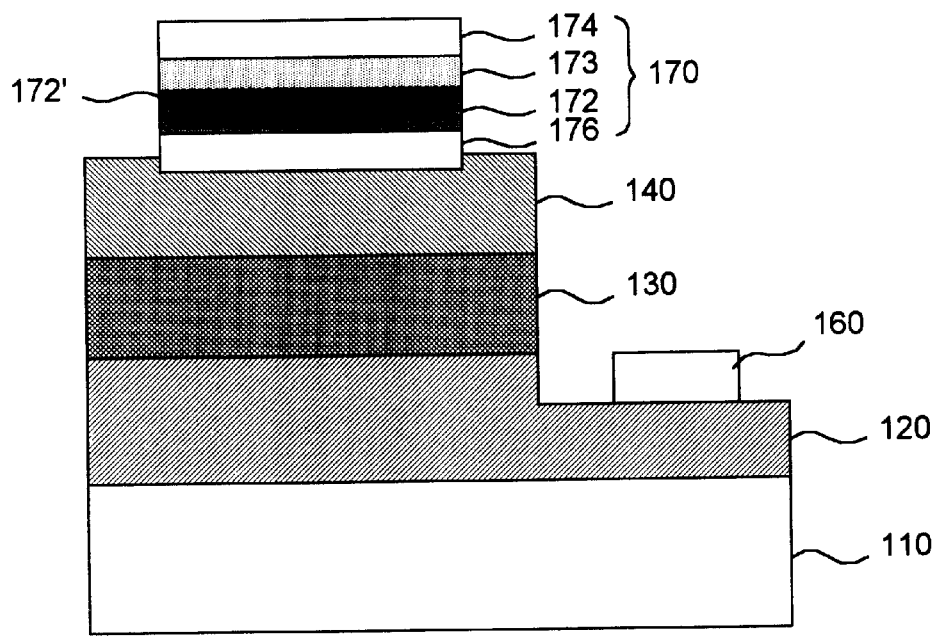

FIGS. 1A and 1B are cross-sectional diagrams for illustrating the method of fabricating a p-type ohmic metal electrode according to the first embodiment of the present invention, especially with respect to application to optical devices.

FIG. 1A illustrates the steps of forming a contact layer 172, Ru layer 173, and $RuO_x$ layer 174. First, an n-type nitride compound semiconductor layer 120, an active layer 130 emitting light, and a p-type nitride compound semiconductor layer 140 are sequentially deposited on the substrate 110, and then they are mesa etched to expose the n-type nitride compound semiconductor layer 120.

Thereafter, a contact layer 172, Ru layer 173, and $RuO_x$ layer 174 are sequentially deposited by lift-off techniques to form a pattern structure. Then, an n-type ohmic metal electrode 160 is formed.

The contact layer 172 may be a single-layer structure comprised of Pt, Ti, Cr, Pd, Ni, Ta, W, or Mo, or a multi-level structure comprised of a combination of such single-layers. The Ru layer 173 is deposited by using an electron-beam evaporation system or a sputter.

FIG. 1B is a cross-sectional diagram for illustrating the step of forming the p-type ohmic metal electrode 170. First, the heating process is carried out in appropriate atmosphere, such as air, oxygen, nitrogen, or argon, in order to form the optimum ohmic contact. Then, the p-type ohmic metal electrode 170, having a structure of contact layer-Ga intermetallic compound layer 176/contact layer 172/Ru-contact layer alloy layer 172'/Ru layer 173/ $RuO_x$ layer 174, is formed on the p-type nitride compound semiconductor layer 140.

The $RuO_x$ layer 174 can be formed artificially by using sputtering, chemical vapor deposition (CVD), or molecular beam epitaxy (MBE), but can also be formed by natural oxidation of the surface of the Ru layer 173. A native $RuO_x$ layer is formed when the Ru layer 173 is exposed to oxygen atmosphere, in which case it is unnecessary to form the $RuO_x$ layer 174 artificially.

When the $RuO_x$ layer 174 is formed artificially, it is possible to use other metal layers in lieu of the Ru layer 173. When the RuOx layer 174 is artificially deposited, the p-type ohmic metal electrode 170 generally has a structure of Ga-contact layer intermetallic compound layer 176/contact layer 172/metallic film-contact layer alloy layer 172'/metallic film/$RuO_x$ 174.

It is also possible to form the RuOx layer by first forming the Ru layer 173 without exposure to oxygen atmosphere, followed by a heating process in oxygen atmosphere.

Conventionally, Au, as in Ni/Au, Pd/Au, Cr/Au, or Pt/Au, was used as the cover layer. In this case, there was a disadvantage that oxygen in the air penetrates into the Au layer, during the heating process for ohmic contact, to contaminate the junction between the contact layer and the nitride compound semiconductor layer. Thus, SBH at the junction increased, and the oxygen or carbon pollutants formed at the junction caused increase of surface charges at the junction such that the carriers became trapped by the layer of pollutants.

Therefore, there was a problem that the specific contact resistance was very high. In addition, the increase in the interfacial roughness at the junction due to the layer of pollutants caused scattering of light, resulting in low light transmittance. Thus, it was difficult to develop high-efficiency optical devices.

Also, disassociation of the nitride compound semiconductor was easily caused due to the oxygen diffused therein from the outside during the heating process. This caused unnecessary interaction at the junction between the contact layer and the nitride compound semiconductor, resulting in increase of the electrical compensation region, i.e., the depletion region. Thus, leakage current increased and the ohmic metal electrode malfunctioned.

According to the present invention, Ru and $RuO_x$ in lieu of Au is used as the cover layer, thereby effectively preventing penetration of pollutants such as oxygen, carbon, and $H_2O$ in the air and forming a stable metal-Ga intermetallic phase at the junction between the contact layer and the nitride compound semiconductor. The contact layer-Ga intermetallic phase functions to lower the SBH between the contact layer and the nitride compound layer, thereby contributing to enhancement of the ohmic characteristics.

In addition, the stable junction characteristics enable the semiconductor ideality factor to reach near 1 because there is almost no effect from the surface level nor any surface Fermi level pinning. Thus, ohmic degradation due to trapping of carriers at the junction between the metal and the nitride compound semiconductor is effectively reduced.

Furthermore, the electrically stable ohmic contact also enables development of devices that have thermally superior characteristics, because it also functions as the native thermal sink for heat generated at the junction between the metal and the nitride compound semiconductor. In addition, the transparency of the $RuO_x$ layer and the stable junction between the metal and nitride compound semiconductor significantly enhance light transmittance.

Figure 2A:
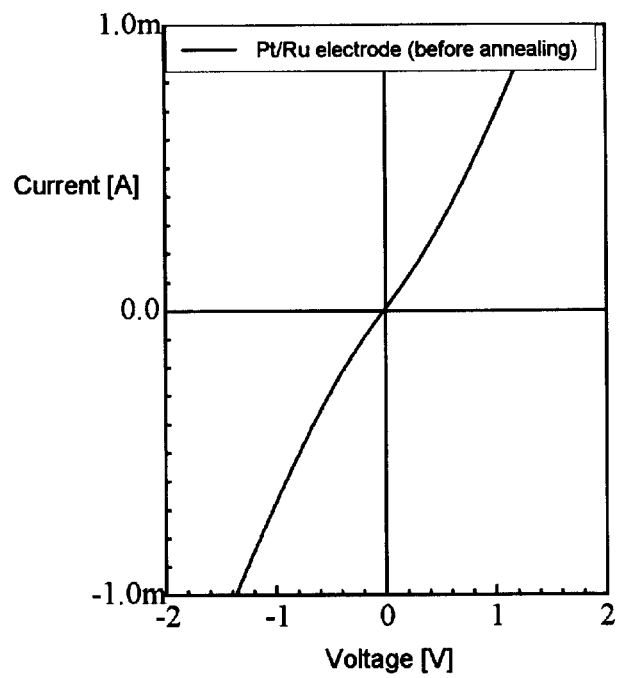
FIGS. 2A, 2B, and 2C are graphs showing the current-voltage curves prior to the heating process when Pt, Pd, and Ni, respectively, were used as the contact layer in the first embodiment.
Figure 2B:
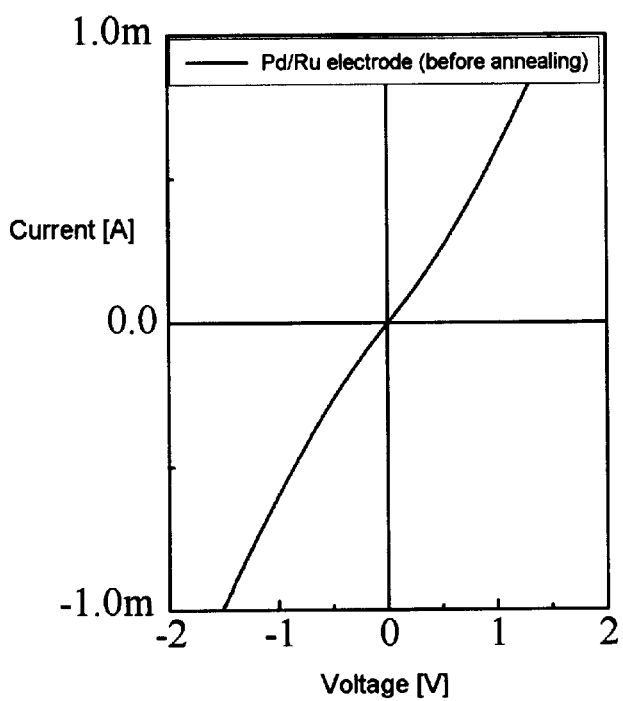
Figure 2C:
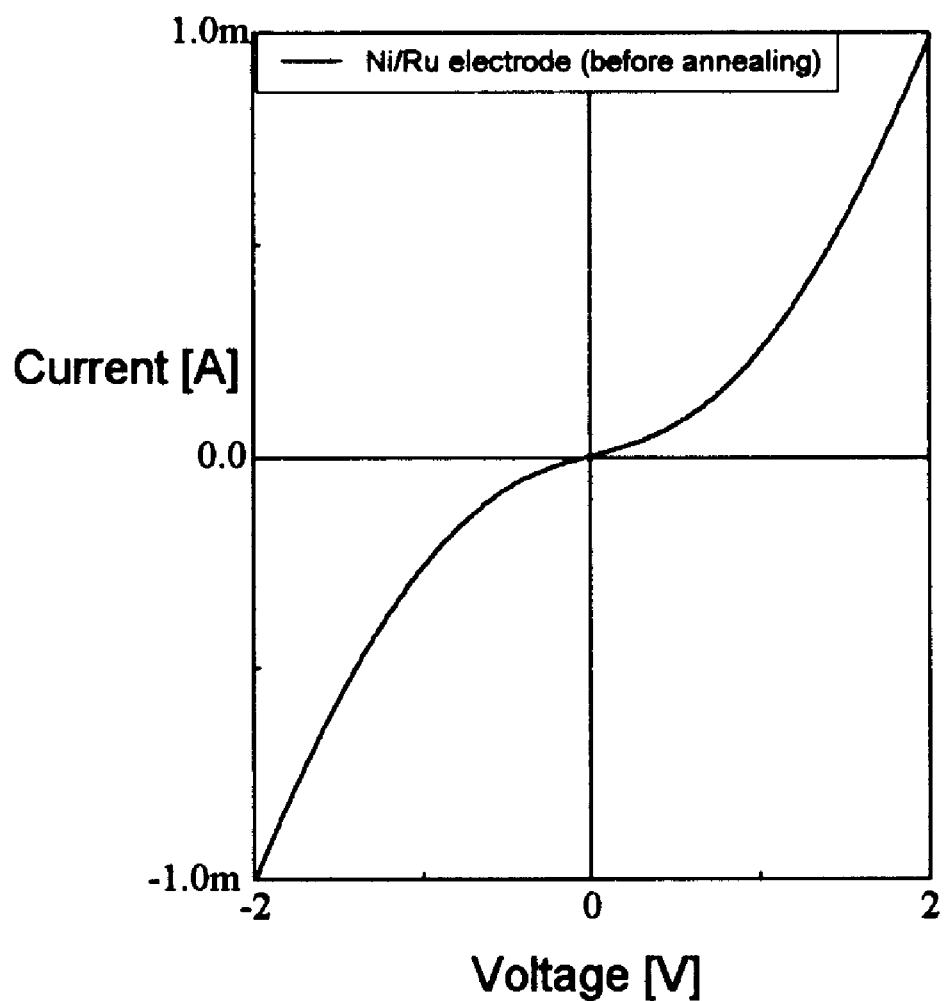
Figure 3A:
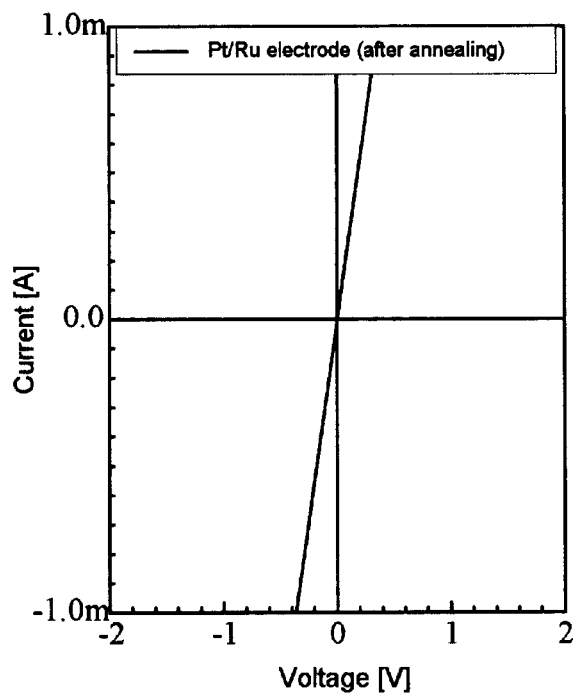
FIGS. 3A through 3C are graphs showing the current-voltage curves subsequent to the heating process carried out at 600° C. for 2 minutes, when Pt, Pd, and Ni, respectively, were used as the contact layer in the first embodiment.
Figure 3B:
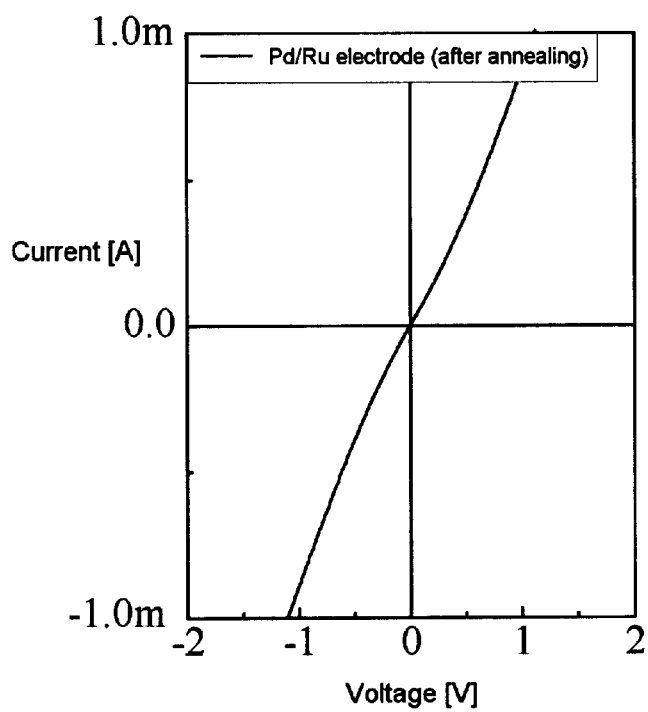
Figure 3C:
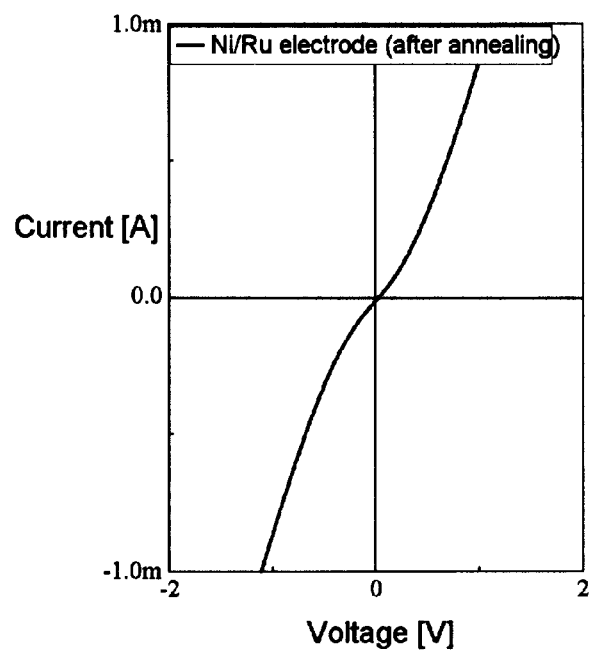

FIGS. 2A, 2B, and 2C are graphs showing the current-voltage curves prior to the heating process when Pt, Pd, and Ni, respectively, were used as the contact layer 172 in the first embodiment. Also, FIGS. 3A through 3C are graphs showing the current-voltage curves subsequent to the heating process carried out at 600° C. for 2 minutes, when Pt, Pd, and Ni, respectively, were used as the contact layer 172 in the first embodiment. Here the specific contact resistance is very low in the range of $10^{-5} \sim 10^{-6}$ $\Omega cm^2$.

The test sample for measurement of the current-voltage characteristics was made as illustrated below.

First, the p-type GaN substrate was cleaned at 60° C. for 5 minutes using trichloroethylene (TCE), acetone, methanol, and distilled water in an ultrasonic bath to form a transmission line model (TLM) pattern.

The TLM pattern is formed for electrical separation of TLM's. The TLM pattern is formed by forming a mesa structure by use of plasma etching technique, followed by photolithography to form uniform 200×100 $\mu m^2$ size rectangular pads separated by 35 $\mu m$ on the mesa structure.

After forming the TLM pattern, the sample with the TLM pattern is dipped into B.O.E. solution for 1 minute in order to remove the native oxide existing on the nitride compound semiconductor. Then, the sample is immediately put into the metallic vapor chamber.

Thereafter, metal is deposited on the sample to a thickness of 20 nm under pressure of $10^{-7}$ torr. Pt, Pd, and Ni, which are typically used for ohmic contacts on p-type GaN substrates, were used as the metal for deposition. Then, Ru is deposited on the deposited metal to a thickness of 50 nm. Subsequently, the sample is subject to lift-off processing using acetone to form the TLM pattern. Thereafter, heating process was carried out on the sample by rapid thermal annealing (RTA) in air, oxygen, nitrogen, and argon atmosphere. The heating process was preferably carried out for 2 minutes in the temperature range of 300~700° C. and, more preferably, at 600° C.

Figure 4:
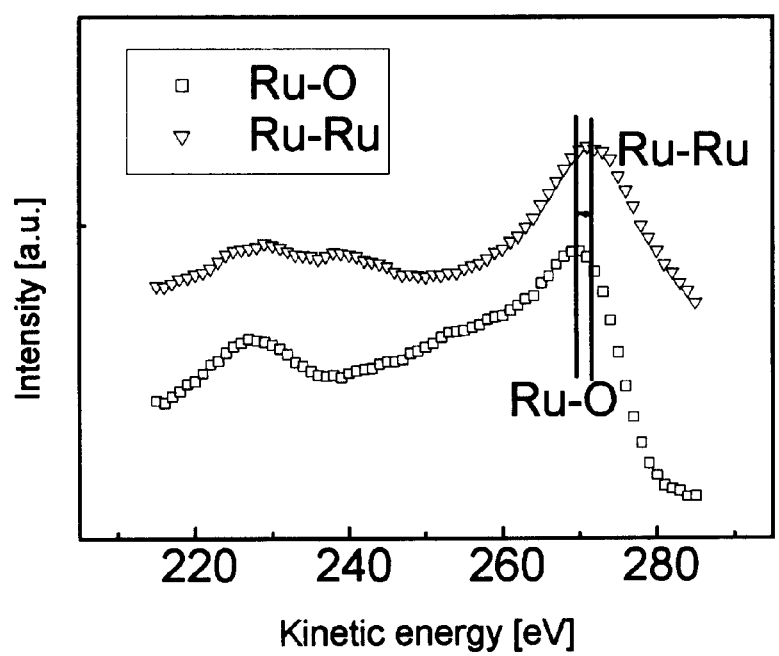
FIG. 4 is a graph showing the existence of a $RuO_x$ layer in the first embodiment, obtained by using Auger Electron Spectroscopy (AES)

FIG. 4 is a graph showing the existence of the $RuO_x$ layer 174 in the first embodiment, obtained by using Auger Electron Spectroscopy (AES).

Figure 5:
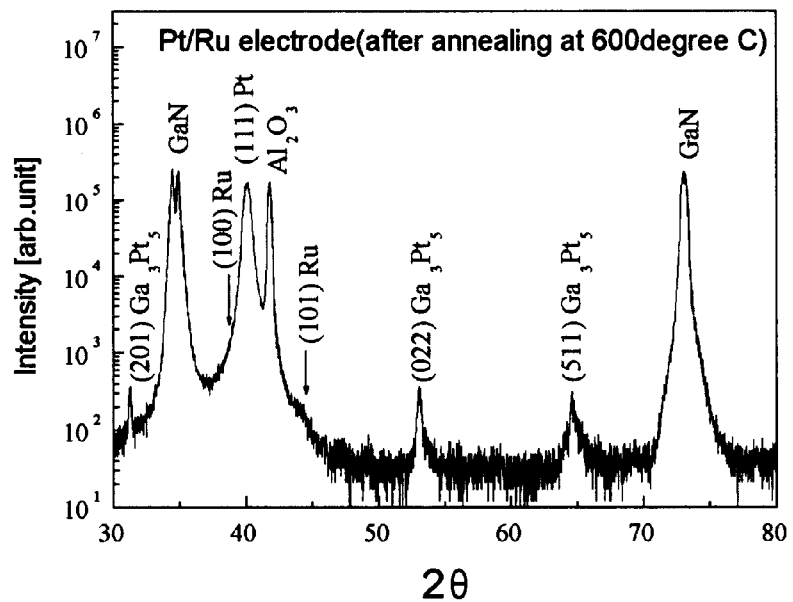
FIG. 5 is a graph verifying the existence of a Pt—Ga intermetallic compound layer when Pt is used as the contact layer in the first embodiment, obtained by using glancing x-ray diffraction (GXRD)

FIG. 5 is a graph verifying the existence of the Pt—Ga intermetallic compound layer 176 when Pt is used as the contact layer 172 in the first embodiment, obtained by using glancing x-ray diffraction (GXRD). The heating process was carried out at 600° C. The p-type ohmic metal electrode 170 has a structure of Pt—Ga intermetallic compound layer/Pt/ Ru—Pt alloy layer/Ru/$RuO_x$ deposited on the p-type nitride compound semiconductor. Referring to FIG. 5, the Pt—Ga intermetallic compound is $Ga_3Pt_5$.

Figure 6:
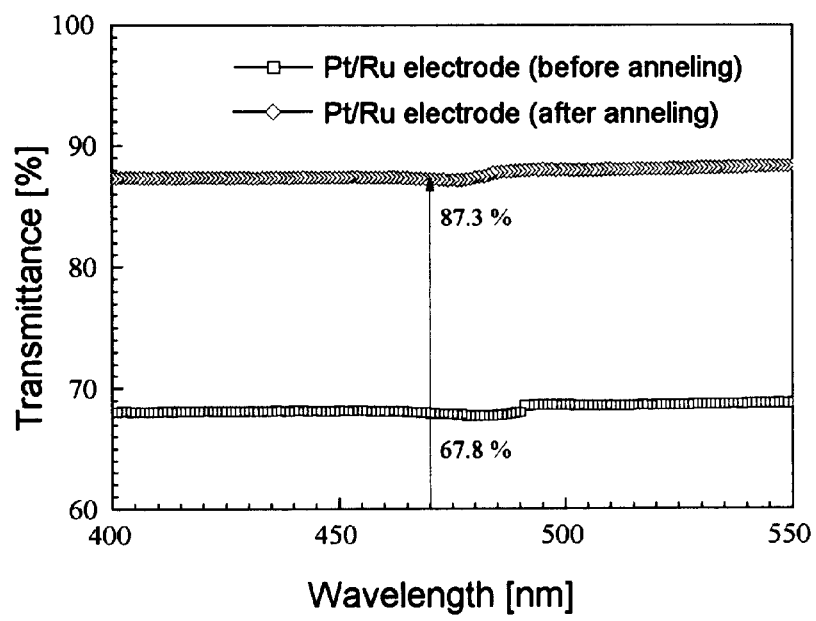
FIG. 6 is a graph showing the light transmittance when Pt is used as the contact layer in the first embodiment.

FIG. 6 is a graph showing the light transmittance when Pt is used as the contact layer 172 in the first embodiment. The light transmittance was measured by using a UV spectrum analyzer. Referring to FIG. 6, the light transmittance almost reaches 90% subsequent to the heating process at 600° C.

Figure 7:
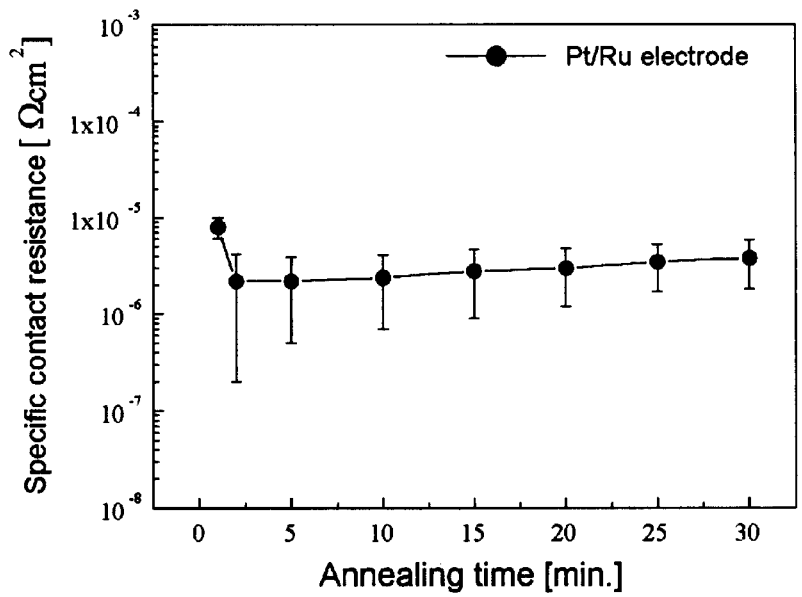
FIG. 7 is a graph showing the measurement of thermal stability when Pt is used as the contact layer in the first embodiment and the heating process is carried out at 600° C.

FIG. 7 is a graph showing the measurement of thermal stability when Pt is used as the contact layer 172 in the first embodiment and the heating process is carried out at 600° C. Referring to FIG. 7, it can be seen that the thermal stability is very good.

[The Second Embodiment]

Figure 8A:
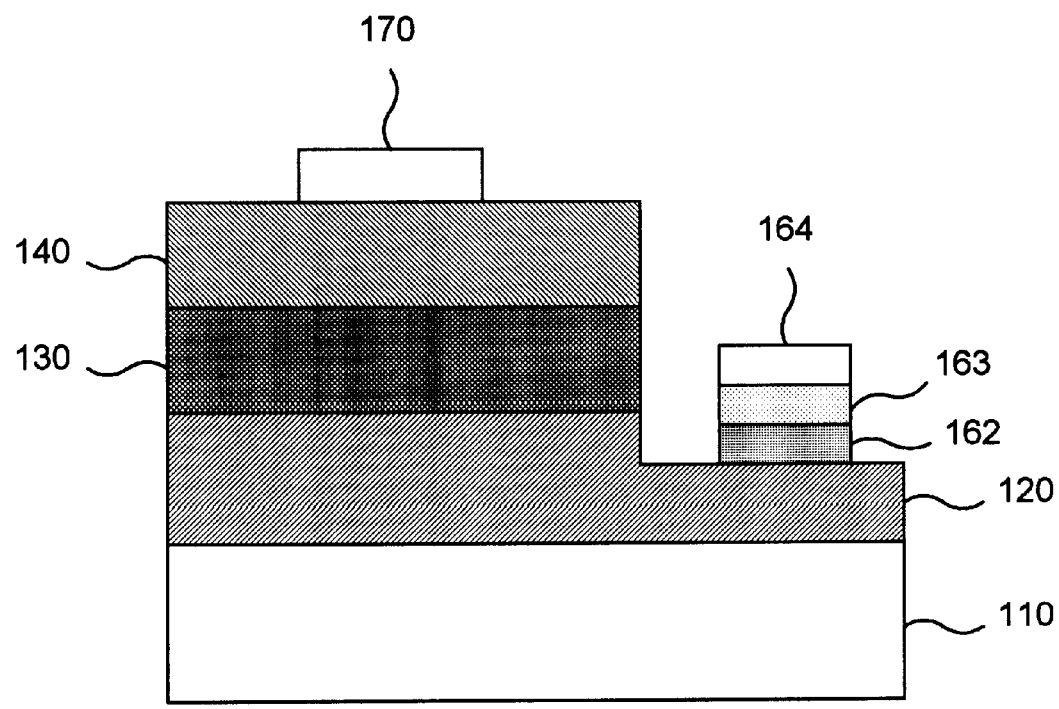
FIGS. 8A and 8B are cross-sectional diagrams for illustrating the method of fabricating an n-type ohmic metal electrode according to the second embodiment of the present invention.
Figure 8B:
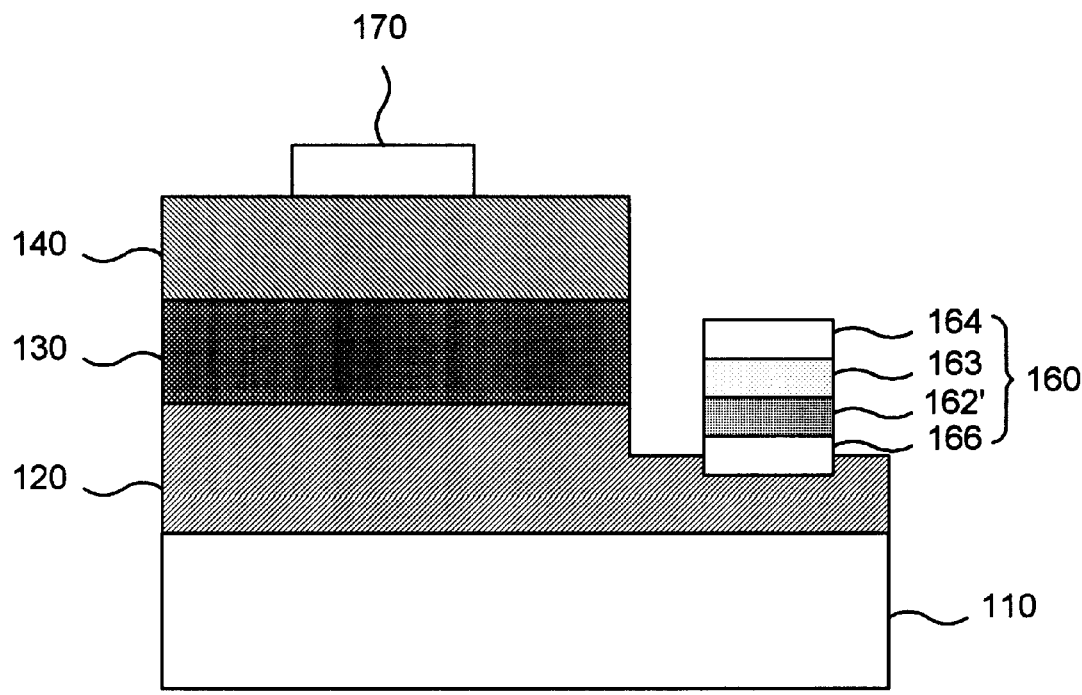

FIGS. 8A and 8B are cross-sectional diagrams for illustrating the method of fabricating an n-type ohmic metal electrode according to the second embodiment of the present invention.

The n-type ohmic metal electrode 160 is formed as illustrated below.

First, a pattern of sequentially deposited Ti/Al double-layer contact layer 162, Ru layer 163, and Au layer 164 is formed on the n-type nitride compound semiconductor 120 by way of lift-off technique. Thereafter, heating process is carried out in appropriate atmosphere such as air, oxygen, nitrogen, or argon in order to form the optimum ohmic contact. Then, the n-type ohmic metal electrode 160 having a TiN layer 166/Al-Ti alloy layer 162'/Ru layer 163/Au layer 164 structure is formed on the n-type nitride compound layer 120.

Conventionally, Ni or Pt was used as the diffusion barrier for the n-type ohmic metal electrode. However, Ru is used as the diffusion barrier in the present invention.

According to the present invention, the use of Ru as the diffusion barrier enables effective formation of metal-nitride phase such as titanium nitride that enhances the ohmic characteristics during the heating process, without destruction of the junction. Thus, the SBH at the junction between the metal and the nitride compound semiconductor is reduced.

The formation of metal-nitride phase causes nitrogen vacancy in the n-type nitride compound semiconductor.

Because nitrogen vacancy functions as donors, this in effect results in increase of the doping concentration in the n-type nitride compound semiconductor. Thus, it is possible to fabricate a superior n-type ohmic metal electrode having a low specific contact resistance.

In addition, the thermally stable Ru greatly enhances the thermal stability of the ohmic metal electrode. Thus, the reliability and life of the device are also enhanced. Also, Ru contributes to a stable junction, resulting in high light transmittance through the n-type ohmic metal electrode.

Figure 9A:
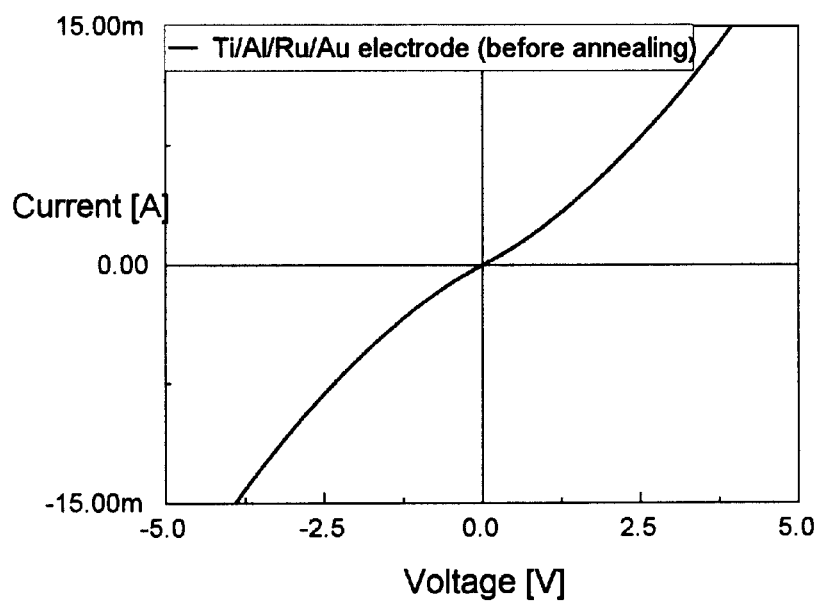
FIG. 9A is a graph showing the current-voltage curve prior to the heating process in the second embodiment.
Figure 9B:
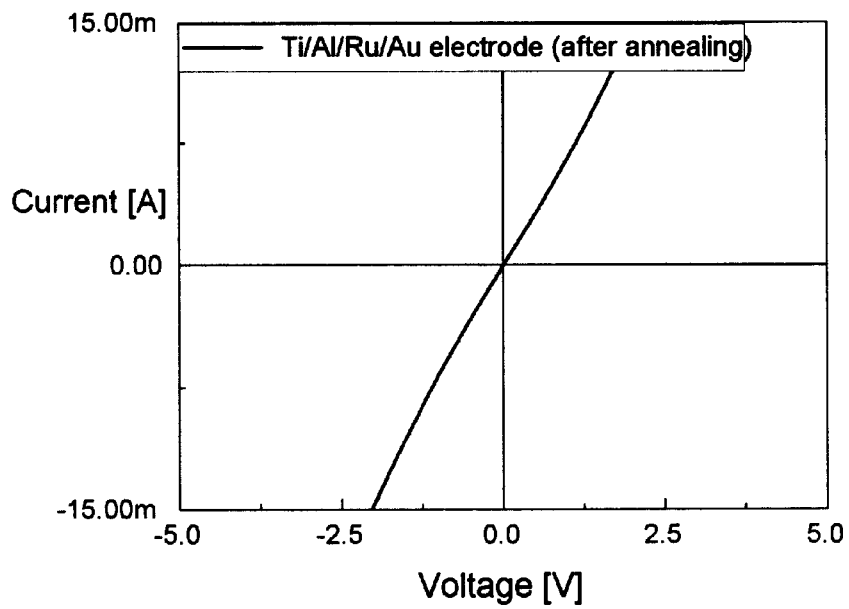
FIG. 9B is a graph showing the current-voltage curve subsequent to the heating process in the second embodiment.

FIG. 9A is a graph showing the current-voltage curve prior to the heating process in the second embodiment. The thickness of Ti, Al, Ru, and Au was 20 nm, 30 nm, 30 nm, and 50 nm, respectively. FIG. 9B is a graph showing the current-voltage curve subsequent to the heating process in the second embodiment. The heating process was carried out preferably in a temperature range of 300~800° C. Here, it was carried out at 600° C. for 1 minute. Referring to FIG. 9B, the specific contact resistance is very low in the range of $10^{-5}$~$10^{-6}$ $\Omega cm^2$.

Figure 10:
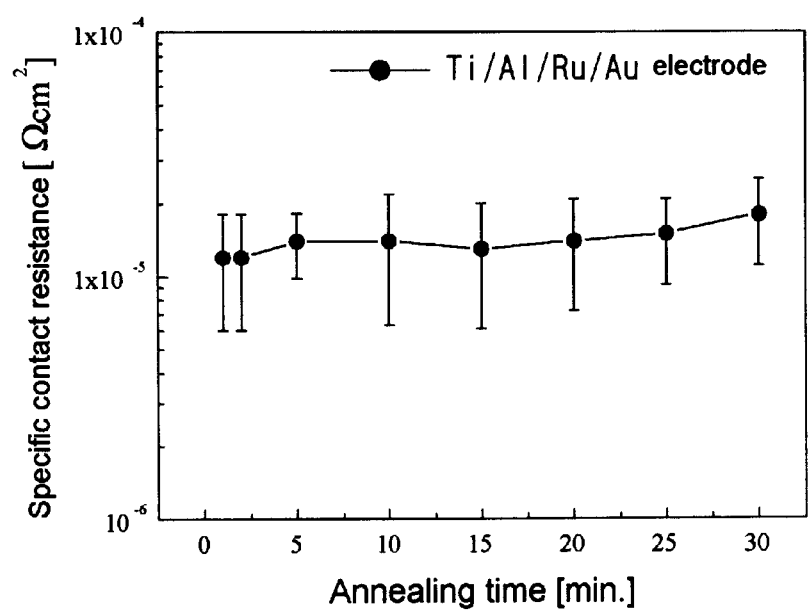
FIG. 10 is a graph showing the results of the thermal stability tests of the Ti/Al/Ru/Au ohmic metal electrode carried out at 600° C., which is the temperature at which the ohmic contacts are formed.

FIG. 10 is a graph showing the results of the thermal stability tests of the Ti/Al/Ru/Au ohmic metal electrode carried out at 600° C., which is the temperature at which the ohmic contacts are formed. Referring to FIG. 10, the thermal stability is very good.

[The Third Embodiment]

Figure 11A:
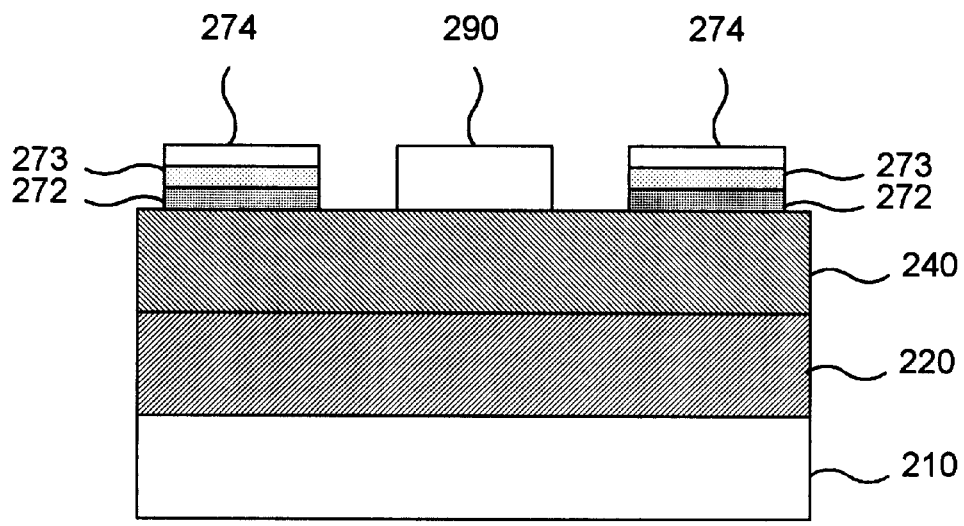
FIGS. 11A and 11B are cross-sectional diagrams for illustrating the method of fabricating a p-type ohmic metal electrode according to the third embodiment of the present invention.
Figure 11B:
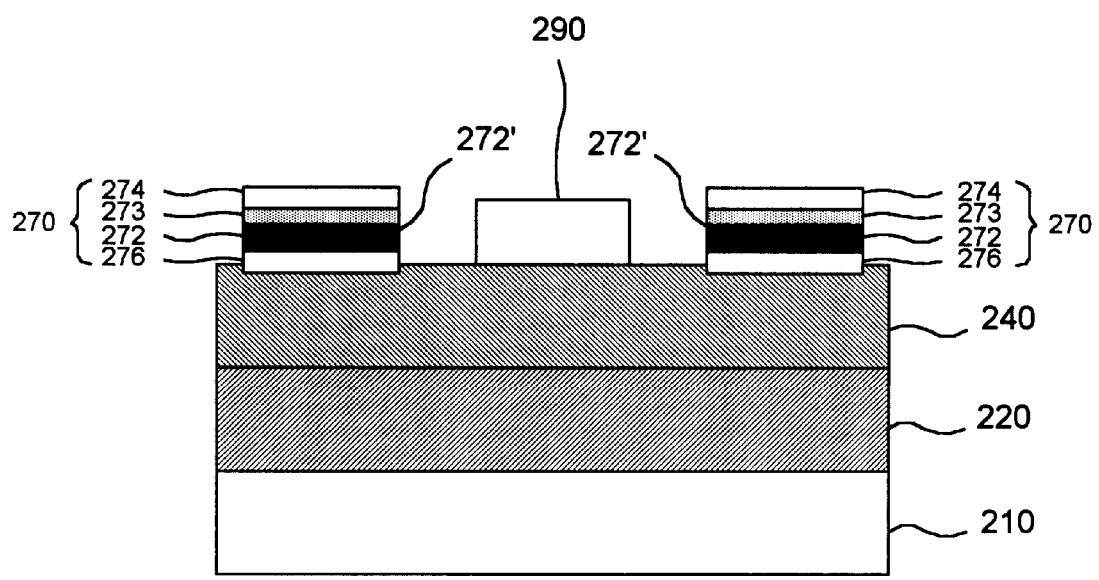

FIGS. 11A and 11B are cross-sectional diagrams for illustrating the method of fabricating a p-type ohmic metal electrode according to the third embodiment of the present invention. The third embodiment is applicable to electronic devices such as HEMT or MESFET.

First, the n-type nitride compound semiconductor layer 220 and the p-type nitride compound semiconductor layer 240 are sequentially formed on the substrate 210. Thereafter, the gate electrode 290 is formed on the p-type nitride compound semiconductor layer 240, and then the source/drain electrodes 270 are formed. It is also possible to form the source/drain electrodes 270 first and then form the gate electrode 290.

Although the terms source/drain electrodes 270 and gate electrode 290 are used herein, they may be emitter, base, and collector electrodes depending upon the type of device. The method of forming the source/drain electrodes 270 is same as the method of forming the p-type ohmic metal electrode 170 according to the first embodiment. Also, like numerals as in FIG. 1B refer to like elements.

[The Fourth Embodiment]

Figure 12A:
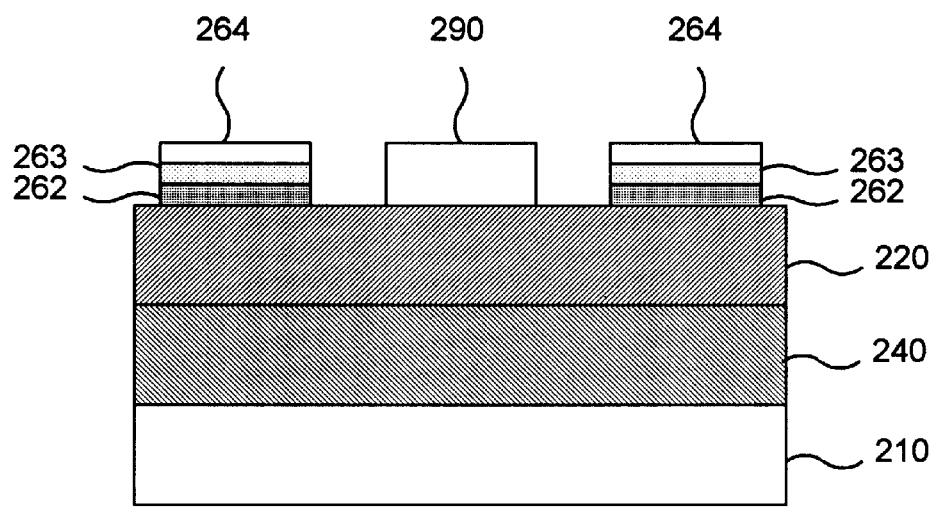
FIGS. 12A and 12B are cross-sectional diagrams for illustrating the method of fabricating an n-type ohmic metal electrode according to the fourth embodiment of the present invention.
Figure 12B:
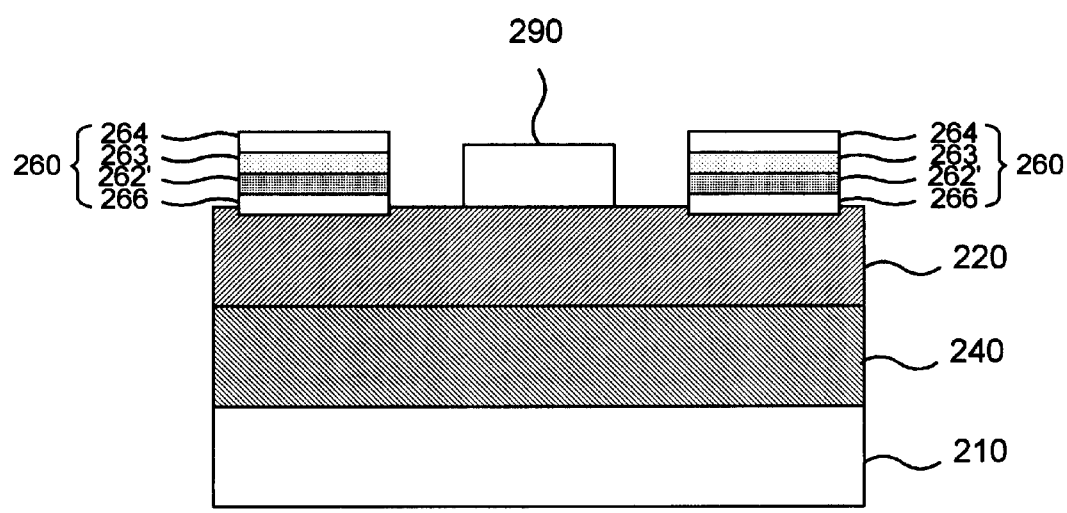

FIGS. 12A and 12B are cross-sectional diagrams for illustrating the method of fabricating an n-type ohmic metal electrode according to the fourth embodiment of the present invention. In this case, as opposed to the third embodiment, the p-type nitride compound semiconductor layer 240 is formed before the n-type nitride compound semiconductor layer 220 is formed. Thus, the gate electrode 290 and the source/drain electrodes 260 are formed on the n-type nitride compound semiconductor layer 220. The method of forming the source/drain electrodes 260 is same as the method of forming the n-type ohmic metal electrode 160 according to the second embodiment.

[Comparison]

Figure 13A:
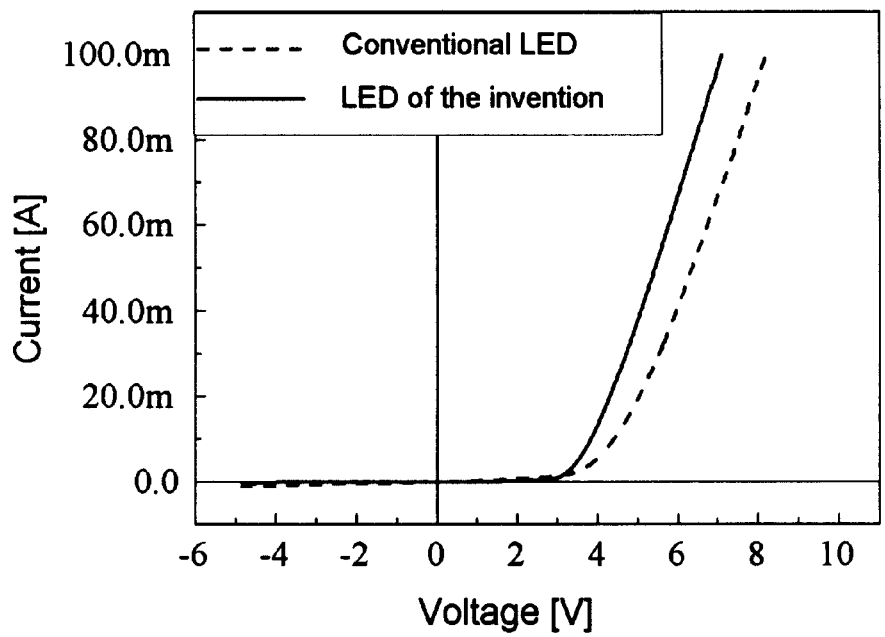
FIG. 13A is a graph showing the current-voltage curves for a multi-quantum well (MQW) LED having a p-type ohmic metal electrode with a Pt/Ru/RuOx system and an n-type ohmic metal electrode with a Ti/Al/Ru/Au system according to the present invention and for a conventional LED having a p-type ohmic metal electrode with a Ni/Au system and an n-type ohmic metal electrode with a Ti/Al system.

FIG. 13A is a graph showing the current-voltage curves for a multi-quantum well (MQW) LED having a p-type ohmic metal electrode with a Pt/Ru/RuOx system and an n-type ohmic metal electrode with a Ti/Al/Ru/Au system according to the present invention and for a conventional LED having a p-type ohmic metal electrode with a Ni/Au system and an n-type ohmic metal electrode with a Ti/Al system. Also, FIG. 13B is a graph showing the current-output curves for a multi-quantum well (MQW) LED having a p-type ohmic metal electrode with a Pt/Ru/RuO$_x$ system and an n-type ohmic metal electrode with a Ti/Al/Ru/Au system according to the present invention and for a conventional LED having a p-type ohmic metal electrode with a Ni/Au system and an n-type ohmic metal electrode with a Ti/Al system.

Figure 13B:
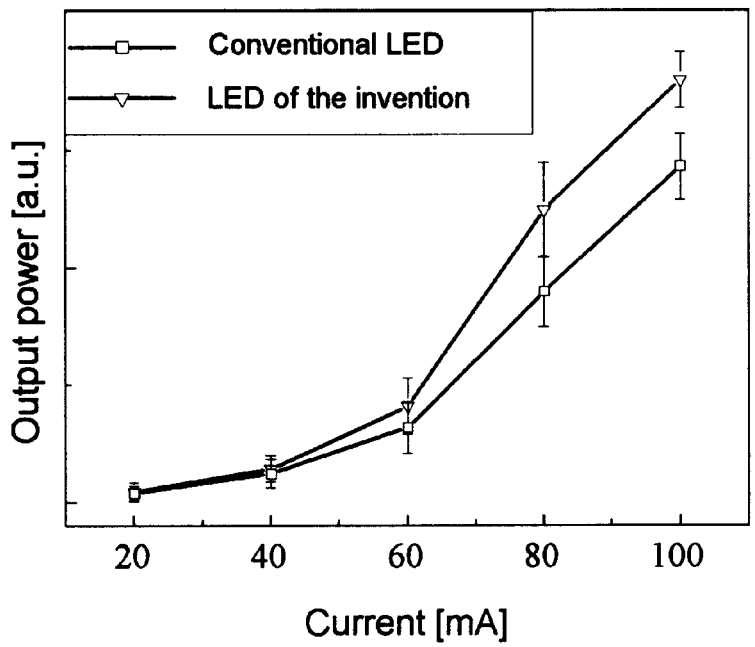
FIG. 13B is a graph showing the current-output curves for a multi-quantum well (MQW) LED having a p-type ohmic metal electrode with a Pt/Ru/RuOx system and an n-type ohmic metal electrode with a Ti/Al/Ru/Au system according to the present invention and for a conventional LED having a p-type ohmic metal electrode with a Ni/Au system and an n-type ohmic metal electrode with a Ti/Al system.

Referring to FIGS. 13A and 13B, it can be seen that the current-voltage characteristics and the current-output characteristics of the LED according to the present invention are enhanced by 20%~30% compared with those of the conventional LED.

As illustrated above, the method of fabricating an ohmic metal electrode according to the present invention uses Ru and RuOx as the cover layer in case of a p-type ohmic metal electrode. Also, the method of the present invention uses Ru as the diffusion barrier layer in case of an n-type ohmic metal electrode. This enables fabrication of devices having electrical, optical, and thermal characteristics that are superior to those of conventional devices.

The superior thermal, electrical characteristics of the ohmic metal electrode according to the present invention enables reduction of electrical loss at the junction between the metal and the nitride compound semiconductor. Thus, structural degradation of characteristics is prevented. Also, the present invention enables development of high-quality optical and electronic devices such as short-wavelength blue/green laser diodes and high-speed electronic devices.

Although the present invention has been illustrated with reference to embodiments of the present invention, various modifications are possible within the scope of the present invention by a person skilled in the art. Therefore, the scope of the present invention should be defined not by the illustrated embodiments but by the attached claims.

What is claimed is:

1. A method of fabricating an ohmic metal electrode, the method comprising the steps of:

sequentially forming a contact layer and a Ru layer on a p-type nitride compound semiconductor; and carrying out a heating process in air, argon, nitrogen, and/or oxygen atmosphere.

2. The method of fabricating an ohmic metal electrode as claimed in claim 1, wherein the contact layer is comprised of a single-layer structure comprising Pt, Ti, Cr, Pd, Ni, Ta, W, or Mo, or a multi-layer structure comprising a combination of the single layer structures.

3. The method of fabricating an ohmic metal electrode as claimed in claim 1, wherein the contact layer is comprised of Pt, Pd, or Ni, and the heating process is carried out in a temperature range of 300~700° C.

4. A method of fabricating an ohmic metal electrode, the method comprising the steps of:

sequentially forming a contact layer and a Ru layer on a p-type nitride compound semiconductor;

exposing the Ru layer to air or oxygen atmosphere; and carrying out a heating process in air, argon, nitrogen, and/or oxygen atmosphere.

5. The method of fabricating an ohmic metal electrode as claimed in claim 4, wherein the contact layer is comprised of a single-layer structure comprising Pt, Ti, Cr, Pd, Ni, Ta, W, or Mo, or a multi-layer structure comprising a combination of the single layer structures.

6. The method of fabricating an ohmic metal electrode as claimed in claim 4, wherein the contact layer is comprised of Pt, Pd, or Ni, and the heating process is carried out in a temperature range of 300~700° C.

7. A method of fabricating an ohmic metal electrode, the method comprising the steps of:

sequentially forming a contact layer, a metallic layer, and a $RuO_x$ layer on a p-type nitride compound semiconductor; and carrying out a heating process.

8. The method of fabricating an ohmic metal electrode as claimed in claim 7, wherein the contact layer is comprised of a single-layer structure comprising Pt, Ti, Cr, Pd, Ni, Ta, W, or Mo, or a multi-layer structure comprising a combination of the single layer structures.

9. The method of fabricating an ohmic metal electrode as claimed in claim 7, wherein the contact layer is comprised of Pt, Pd, or Ni, and the heating process is carried out in a temperature range of 300~700° C.

10. The method of fabricating an ohmic metal electrode as claimed in claim 7, wherein the $RuO_x$ layer is formed by sputtering, chemical vapor deposition, or molecular beam epitaxy.

11. The method of fabricating an ohmic metal electrode as claimed in claim 7, wherein the metallic layer is comprised of Ru.

12. A method of fabricating an ohmic metal electrode, the method comprising the steps of:

sequentially forming a contact layer, a Ru layer, and a conductive layer on an n-type nitride compound semiconductor; and carrying out a heating process.

13. The method of fabricating an ohmic metal electrode as claimed in claim 12, wherein the contact layer is comprised of a single-layer structure comprising Ti, Cr, Mo, Nb, Ta, or W, or a multi-layer structure comprising a combination of the single layer structures.

14. The method of fabricating an ohmic metal electrode as claimed in claim 12, wherein the contact layer is comprised of Ti, and the heating process is carried out in a temperature range of 300~800° C.

* * * * *